(12) United States Patent
Tofighbakhsh et al.

(10) Patent No.: US 10,436,835 B2
(45) Date of Patent: *Oct. 8, 2019

(54) CONFIGURABLE PROBE BLOCKS FOR SYSTEM MONITORING

(71) Applicant: AT&T Intellectual Property I, L.P., Atlanta, GA (US)

(72) Inventors: Mostafa Tofighbakhsh, Cupertino, CA (US); Thomas A. Anschutz, Conyers, GA (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/971,304

(22) Filed: May 4, 2018

(65) Prior Publication Data

US 2018/0252770 A1    Sep. 6, 2018

Related U.S. Application Data

(63) Continuation of application No. 14/633,724, filed on Feb. 27, 2015, now Pat. No. 9,964,590.

(51) Int. Cl.
*G01R 31/317* (2006.01)
*H04L 12/26* (2006.01)
(Continued)

(52) U.S. Cl.
CPC .... *G01R 31/31712* (2013.01); *G06F 11/3093* (2013.01); *H04L 41/0803* (2013.01); *H04L 43/12* (2013.01); *G06F 11/3003* (2013.01)

(58) Field of Classification Search
CPC combination set(s) only.
See application file for complete search history.

(56) References Cited

U.S. PATENT DOCUMENTS 5,793,753 A    8/1998    Hershey et al.
6,457,143 B1    9/2002    Yue
(Continued)

FOREIGN PATENT DOCUMENTS

| CA | 2686317 | 11/2008 |
|----|---------|---------|
| EP | 1496442 | 3/2011 |
| EP | 2767056 | 8/2014 |

OTHER PUBLICATIONS

Chen et al., "Cloud Computing-Based Forensic Analysis for Collaborative Network Security Management System," Tsinghua Science and Technology, vol. 18, No. 1, Feb. 2013, 11 pages.
(Continued)

*Primary Examiner* — Mamadou L Diallo
(74) *Attorney, Agent, or Firm* — Hanley, Flight & Zimmerman, LLC

(57) ABSTRACT

Configurable probe blocks for system monitoring are disclosed. Example apparatus disclosed herein include a processor to perform operations including enabling, based on a value of a control word, a first probe input of a probe block, the first probe input mapped to a source of monitored network traffic in a software defined network. Disclosed example apparatus also include configuring, based on the value of the control word, a first trigger condition of the probe block to evaluate the monitored network traffic to determine whether the monitored network traffic has a first characteristic. Disclosed example apparatus further include configuring, based on the value of the control word, a first probe output of the probe block to output a result of the monitored network traffic being evaluated according to the first trigger condition, the first probe output to output the result to a network application of the software defined network.

20 Claims, 9 Drawing Sheets

(51) Int. Cl.
*H04L 12/24* (2006.01)
*G06F 11/30* (2006.01)

(56) References Cited

U.S. PATENT DOCUMENTS

| | | | |
|---|---|---|---|
| 6,738,355 B1 | 5/2004 | Love et al. | |
| 6,807,156 B1 | 10/2004 | Veres et al. | |
| 6,912,600 B2 | 6/2005 | Van Brero et al. | |
| 7,043,549 B2 | 5/2006 | Breese et al. | |
| 7,047,291 B2 | 5/2006 | Breese et al. | |
| 7,167,998 B2 | 1/2007 | Brodie et al. | |
| 7,343,409 B1 | 3/2008 | Kremer et al. | |
| 7,805,736 B2 | 9/2010 | Chagoly et al. | |
| 7,835,886 B2 | 11/2010 | Vogel et al. | |
| 7,877,368 B2 | 1/2011 | Waters et al. | |
| 8,032,627 B2 | 10/2011 | Chagoly et al. | |
| 8,179,895 B2 | 5/2012 | Lean et al. | |
| 8,601,318 B2 | 12/2013 | Huang et al. | |
| 8,713,138 B1 | 4/2014 | Machiraju et al. | |
| 8,831,568 B2 | 9/2014 | Cherian et al. | |
| 2003/0043755 A1* | 3/2003 | Mitchell | H04L 43/0894 370/252 |
| 2004/0193918 A1 | 9/2004 | Green et al. | |
| 2004/0267691 A1 | 12/2004 | Vasudeva | |
| 2008/0137540 A1 | 6/2008 | Botvich | |
| 2008/0232269 A1 | 9/2008 | Tatman et al. | |
| 2010/0020746 A1 | 1/2010 | Zaks | |
| 2010/0265073 A1 | 10/2010 | Harper | |
| 2011/0026406 A1 | 2/2011 | Gamage et al. | |
| 2013/0058248 A1 | 3/2013 | Singh et al. | |
| 2013/0128792 A1 | 5/2013 | Liu et al. | |
| 2014/0289405 A1* | 9/2014 | Tychon | H04L 41/5038 709/224 |
| 2015/0341252 A1 | 11/2015 | Felgate et al. | |
| 2016/0252576 A1 | 9/2016 | Tofighbakhsh et al. | |
| 2017/0085459 A1 | 3/2017 | Xia et al. | |
| 2017/0237642 A1* | 8/2017 | Goel | H04L 43/0888 370/252 |

OTHER PUBLICATIONS

Dunbar, "Plug-and-Play Sensors in Wireless Networks," Instrumentation & Measurement Magazine, IEEE 4.1, Mar. 2001, Abstract, 2 pages.

Houmansadr et al., "The Parrot is Dead: Observing Unobservable Network Communications," 2013 IEEE Symposium on Security and Privacy, DOI 10.1109/SP.2013.14, 2013, 15 pages.

Hu et al., "Design, Implementation, and Testing of Advanced Virtual Coordinate-Measuring Machines," IEEE Transactions on Instrumentation and Measurement, vol. 61, No. 5, May 2012, 9 pages.

Rouvoy et al., "Software Architecture Patterns for a Context-Processing Middleware Framework," IEEE Distributed Systems Online, vol. 9, Issue 6, Jun. 2008, 13 pages.

Solum et al., "Modular Over-the-Wire Configurable Security for Long-Lived Critical Infrastructure Monitoring Systems," Proceedings of the Third ACM International Conference on Distributed Event-Based Systems, 2009, abstract, 2 pages.

United States Patent and Trademark Office, "Notice of Allowability," mailed in connection with U.S. Appl. No. 14/633,724, dated Jan. 17, 2018, 4 pages.

United States Patent and Trademark Office, "Notice of Allowance," mailed in connection with U.S. Appl. No. 14/633,724, dated Jan. 4, 2018, 7 pages.

United States Patent and Trademark Office, "Non-final Office Action," mailed in connection with U.S. Appl. No. 14/633,724, dated May 31, 2017, 8 pages.

* cited by examiner

CONFIGURABLE PROBE BLOCKS FOR SYSTEM MONITORING

RELATED APPLICATION(S)

This patent arises from a continuation of U.S. patent application Ser. No. 14/633,724 (now U.S. Pat. No. 9,964,590), which is entitled "CONFIGURABLE PROBE BLOCKS FOR SYSTEM MONITORING," and which was filed on Feb. 27, 2015. Priority to U.S. patent application Ser. No. 14/633,724 is hereby expressly claimed. U.S. patent application Ser. No. 14/633,724 is hereby incorporated by reference in its entirety.

FIELD OF THE DISCLOSURE

This disclosure relates generally to system monitoring and, more particularly, to configurable probe blocks for system monitoring.

BACKGROUND

Commercial communication networks, such as mobility networks, may employ adjunct probing equipment to perform real-time monitoring. Such equipment may be expensive yet provide only limited, targeted probing functionality. Therefore, if additional, or otherwise different, probing functionality is desired, operators of commercial communication networks may experience costs in terms of additional equipment expense(s) and/or monitoring delays associated with installing different, adjunct probing equipment capable of supporting the additional, and/or different, probing functionality.

BRIEF DESCRIPTION OF THE DRAWINGS

Wherever possible, the same reference numbers will be used throughout the drawing(s) and accompanying written description to refer to the same or like parts, elements, etc.

DETAILED DESCRIPTION

Figure 1:
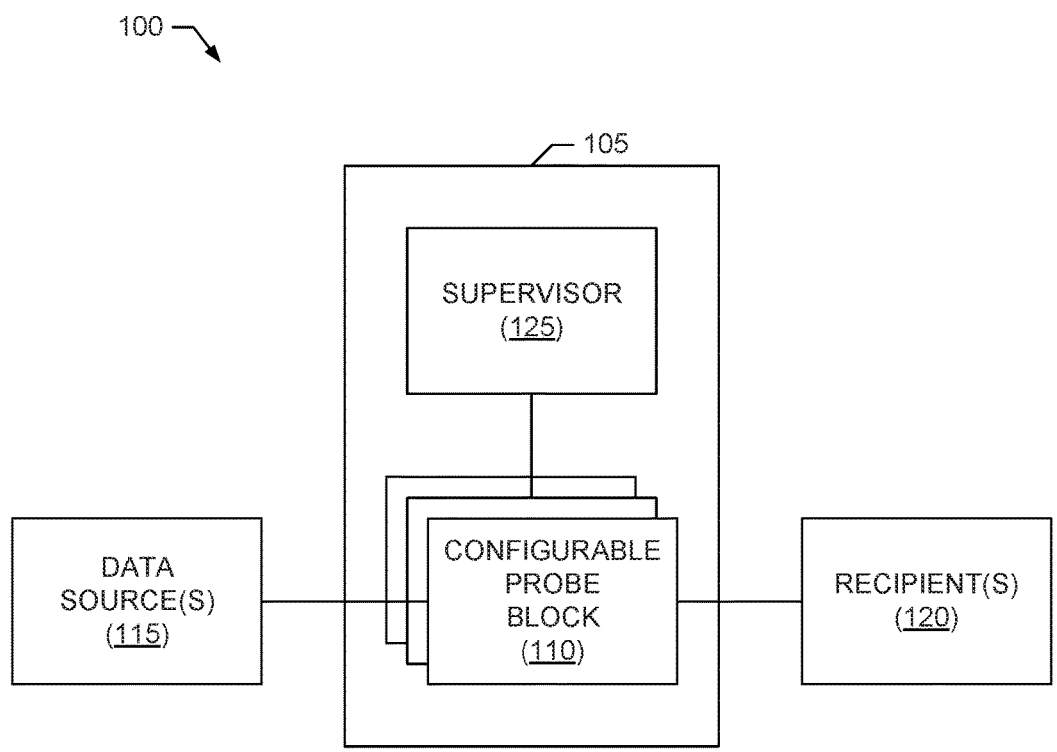
FIG. 1 is a block diagram of a first example environment of use for an example monitoring system including configurable probe blocks implemented in accordance with the teachings of this disclosure.

Configurable probe blocks for system monitoring are disclosed herein. Example methods disclosed herein to monitor a system include configuring a probe block, which is embedded in the system, based on a first value of a control word specifying that a first probe input from a set of available probe inputs associated with the probe block is to be enabled. In some such examples, the control word also specifies that a first trigger condition from a set of available trigger conditions associated with the probe block is to be assigned to the first probe input. Some such disclosed example methods also include processing, in accordance with the configuring of the probe block based on the first value of the control word, monitored data accessible via the probe block to determine probe data to output from the probe block.

In some such disclosed example methods, processing the monitored data includes performing a first action specified by the first value of the control word from a set of available actions associated with the probe block when the first trigger condition assigned to the first probe input is satisfied.

Additionally or alternatively, in some such disclosed example methods, the first value of the control word further specifies that a first timer from a set of available timers associated with the probe block is to be assigned to the first action.

Additionally or alternatively, in some such disclosed example methods, the first value of the control word further specifies that a second probe input from the set of available probe inputs associated with the probe block is to be enabled. In some such disclosed example methods, the control word also specifies that a second trigger condition from the set of available trigger conditions associated with the probe block is to be assigned to the second probe input. In some such disclosed example methods, processing the monitored data includes performing a second action specified by the first value of the control word from the set of available actions associated with the probe block when the second trigger condition assigned to the second probe input is satisfied. In some such disclosed example methods, processing the monitored data also includes applying a first ordering specified by the first value of the control word from a set of possible orderings associated with the probe block to the first action and the second action.

In some such disclosed example methods, the first value of the control word further specifies that a second probe input from the set of available probe inputs associated with the probe block is to be enabled. In some such disclosed example methods, the control word also specifies that a second trigger condition from the set of available trigger conditions associated with the probe block is to be assigned to the second probe input. In some such disclosed example methods, processing the monitored data includes performing a first correlation operation on a first result determined by processing the first probe input based on the first trigger condition and a second result determined by processing the second probe input based on the second trigger condition. In some such disclosed example methods, the first correlation operation is specified by the first value of the control word.

Additionally or alternatively, in some such disclosed example methods, the first value of the control word further specifies that a first probe output from a set of available probe outputs associated with the probe block is to output the probe data from the probe block.

Additionally or alternatively, in some such disclosed example methods, the probe block is a first probe block, the probe data is first probe data, the monitored data corresponds to second probe data output by a second probe block, and the example methods further include operating the first probe block to process the second probe data in accordance with the configuring of the first probe block based on the first value of the control word.

Additionally or alternatively, some such disclosed example methods further include activating operation of the probe block to process the monitored data, and terminating operation of the probe block after operating the probe block for a first interval of time.

These and other example methods, apparatus, systems and articles of manufacture (e.g., physical storage media) to implement and/or utilize configurable probe blocks for system monitoring are disclosed in further detail below.

Prior monitoring of communication networks, and other systems in general, may involve the use of adjunct probing equipment (e.g., test equipment, dedicated monitoring servers, etc.) However, such equipment may increase operational costs while providing only limited, targeted probing functionality. Furthermore, in such prior systems, if additional, or otherwise different, probing functionality is desired, system operators may be subject to further costs, such as additional equipment expense(s) and/or monitoring delays associated with installing different, adjunct probing equipment capable of supporting the additional, and/or different, probing functionality.

In contrast with such prior system monitoring, system monitoring based on configurable probe blocks, as disclosed herein, does not rely on adjunct probing equipment. Instead, example configurable probe blocks disclosed herein can be embedded in the systems to be monitored (e.g., during system manufacturing) and then enabled/configured when appropriate (e.g., during system deployment, installation, activation, etc.). For example, such configurable probe blocks can be implemented as hardware blocks (e.g., hardware logic modules) embedded in hardware components, such as system-on-chip (SoC) devices, implementing the system to be monitored. Additionally or alternatively, example configurable probe blocks disclosed herein can be implemented as software blocks (e.g., software functions, methods, etc.) embedded in the architecture of the system (e.g., in the software architecture) to be monitored. Thus, such configurable probe blocks can be injected into system processing flows, such as traffic and/or signaling flows, without the need for adjunct probing equipment.

Furthermore, example configurable probe blocks disclosed herein provide a host of different probing functionality that is configurable to a specific probing application, and that can be modified over time without the need for additional probing equipment. For instance, an example configurable probe block disclosed herein provides a set of available probe inputs capable of being selectively enabled/disabled, a set of available trigger conditions capable of being selectively assigned to enabled probe input(s), a set of available correlation operations capable of being selectively used to process the enabled probe input(s), a set of available actions capable of being selectively performed when a trigger condition assigned to a probe input is satisfied, a set of available action timers capable of being selectively assigned to a configured action, a set of possible orderings capable of being selectively applied to a group of configured actions, a set of available probe outputs capable of being selectively configured to output probe results determined by the configurable probe block, etc. Accordingly, such configurable probe blocks can be injected into system processing flows, such as traffic and/or signaling flows, with appropriate settings to capture specific monitored/sensed data and to produce specific probe results of interest.

Some example configurable probe blocks disclosed herein can also be chained together by an example supervisor in series, loops, conditional control statements, etc., to implement more complex probing functionality. In some such examples, the configurable probe blocks capture probe data according to their respective configurations and pass the resulting probe data along the chain of probe blocks using appropriately configured I/O ports, memory addresses, memory mapped registers, etc. In some disclosed examples, the supervisor additionally or alternatively manages the operation of a configurable probe block by, for example, controlling when the configurable probe block is activated, when the configurable probe block is to perform its configured probing function(s), and when the configurable probe block is to terminate.

Turning to the figures, a block diagram of an example environment of use 100 for an example monitoring system 105 including one or more configurable probe blocks 110 implemented in accordance with the teachings of this disclosure is illustrated in FIG. 1. The monitoring system 105 of the illustrated example can be implemented by hardware, software, firmware or any combination thereof. In some examples, the monitoring system 105 is implemented by one or more hardware devices, such as one or more SoC devices. In some such examples, one or more of the example configurable probe blocks 110 is(are) embedded in the hardware implementing the monitoring system 105, such as in the interconnect fabric of an integrated circuit (e.g., an SoC device). Additionally or alternatively, in some examples, the monitoring system 105 is implemented by one or more software applications. In some such examples, one or more of the example configurable probe blocks 110 is(are) embedded as one or more software functions, methods, etc., of the applications(s) implementing the monitoring system 105. In some examples, the monitoring system 105 is separate from the source of the data to be monitored by the configurable probe block(s) 110, whereas in other examples, the monitoring system 105 is implemented by the source of the data to be monitored by the configurable probe block(s) 110.

In the illustrated example of FIG. 1, the example configurable probe block(s) 110 is(are) structured to monitor data from one or more example data source(s) 115 and provide probe results to one or more example recipient(s) 120. The example data source(s) 115 can be one or more memory addresses, memory-mapped registers, input/output (I/O) ports, etc., or any combination thereof, that is(are) to receive the data to be monitored. The monitored data can be any type of data capable of being received and/or provided by such data source(s) 115, and capable of conveying any type of information. For example, the monitored data accessible by the configurable probe block(s) 110 from the data source(s) 115 can be (1) traffic, such as data packets, control messages, etc., being routed in a communication network, (2) sensor data provided by the one or more sensor(s), such as one or more acoustic sensors, optical sensors, vibration sensors, fluid level sensors, voltage meters, current meters, vacuum sensors, etc., or any combination thereof.

The example recipient(s) 120 can be one or more memory addresses, memory-mapped registers, input/output (I/O) ports, etc., or any combination thereof, that is(are) to receive the probe results produced by the configurable probe block (s) 110. In some such examples, other applications, devices, systems, etc., are able to access the probe results made available at/by the example recipient(s) 120. In some examples, the recipient(s) 120 include an example data interface, such as the example interface circuit 820 of FIG. 8, which permits the probe results to be transmitted to a remote destination via one or more networks, data connections, etc.

An example configurable probe block 110 in the example environment of use 100 provides a host of different probing functionality that is programmable, selectable and/or otherwise configurable, via an example supervisor 125 to implement one or more specific probing operation(s). Furthermore, the specific probing operation(s) implemented by the example configurable probe block 110 can be modified by the example supervisor 125 over time without needing to update, replace, and/or otherwise modify the structure of the configurable probe block 110. In some examples, a configurable probe block 110, as disclosed herein, provides a set of available probe inputs capable of being selectively enabled/disabled by the supervisor 125, and a set of available probe outputs capable of being selectively configured by the supervisor 125 to output probe results determined by the configurable probe block 110. In some such examples, the supervisor 125 maps and/or otherwise configures one or more of the data source(s) 115 to be in communication with one or more respective probe inputs in the set of available probe inputs of the configurable probe block 110. Similarly, in some such examples, the supervisor 125 maps and/or otherwise configures one or more of the recipients(s) 120 to be in communication with one or more respective probe outputs in the set of available probe outputs of the configurable probe block 110. As used herein, the phrase "in communication," including variants thereof, encompasses direct communication and/or indirect communication through one or more intermediary components and does not require direct physical (e.g., wired) communication and/or constant communication, but rather additionally includes selective communication at periodic or aperiodic intervals, as well as one-time events.

In some examples, a configurable probe block 110, as disclosed herein, provides a set of available trigger conditions capable of being assigned by the supervisor 125 to the enabled probe input(s). In some examples, a configurable probe block 110, as disclosed herein, provides a set of available correlation operations capable of being configured by the supervisor 125 to process combinations of the enabled probe input(s) (e.g., when the trigger condition(s) assigned to the enabled probe input(s) is(are) satisfied). In some examples, a configurable probe block 110, as disclosed herein, provides a set of available actions, which the supervisor 125 can configure to be performed when a trigger condition assigned to a probe input is satisfied. In some examples, a configurable probe block 110, as disclosed herein, provides a set of available action timers capable of being assigned by the supervisor 125 to a configured action. In some examples, a configurable probe block 110, as disclosed herein, provides a set of possible orderings, which the supervisor 125 can configure to be applied to a group of configured actions. Examples of the probing functionality provided by an example configurable probe block 110, and configuration of such probing functionality by the example supervisor 125, are described in further detail below.

In some examples, the supervisor 125 controls operation of a particular configurable probe block 110 by controlling when the configurable probe block 110 is activated and/or when operation of the configurable probe block 110 is terminated. For example, the supervisor 125 may include and/or have access to one or more timers (or clocks or similar timing sources). In some such examples, the supervisor 125 implements control logic to use a timer to determine when to wake and activate an example configurable probe block 110. Additionally or alternatively, the supervisor 125 implements control logic to use the same or a different timer to track a monitoring interval to determine when to terminate operation of the example configurable probe block 110. Additionally or alternatively, in some examples the supervisor 125 implements control logic to track one or more events that is(are) to trigger activation and/or termination of the example configurable probe block 110.

In some examples, the supervisor 125 implements control logic to chain together multiple configurable probe blocks 110 in series, loops, etc., to implement more complex probing functionality. In some such examples, the control logic implemented by the supervisor 125 to chain together multiple configurable probe blocks 110 also includes conditional logic, such as conditional control statements (e.g., if-then-else statements) to condition operation of ones of the configurable probe blocks 110 in the chain. To implement the chaining of multiple configurable probe blocks 110, in some examples, the supervisor 125 maps and/or otherwise configures the probe output(s) of configurable probe block(s) 110 earlier in the chain to be in communication (e.g., via configured I/O ports, memory addresses, memory mapped registers, etc.) with probe input(s) of configurable probe block(s) 110 later in the chain.

Figure 2:
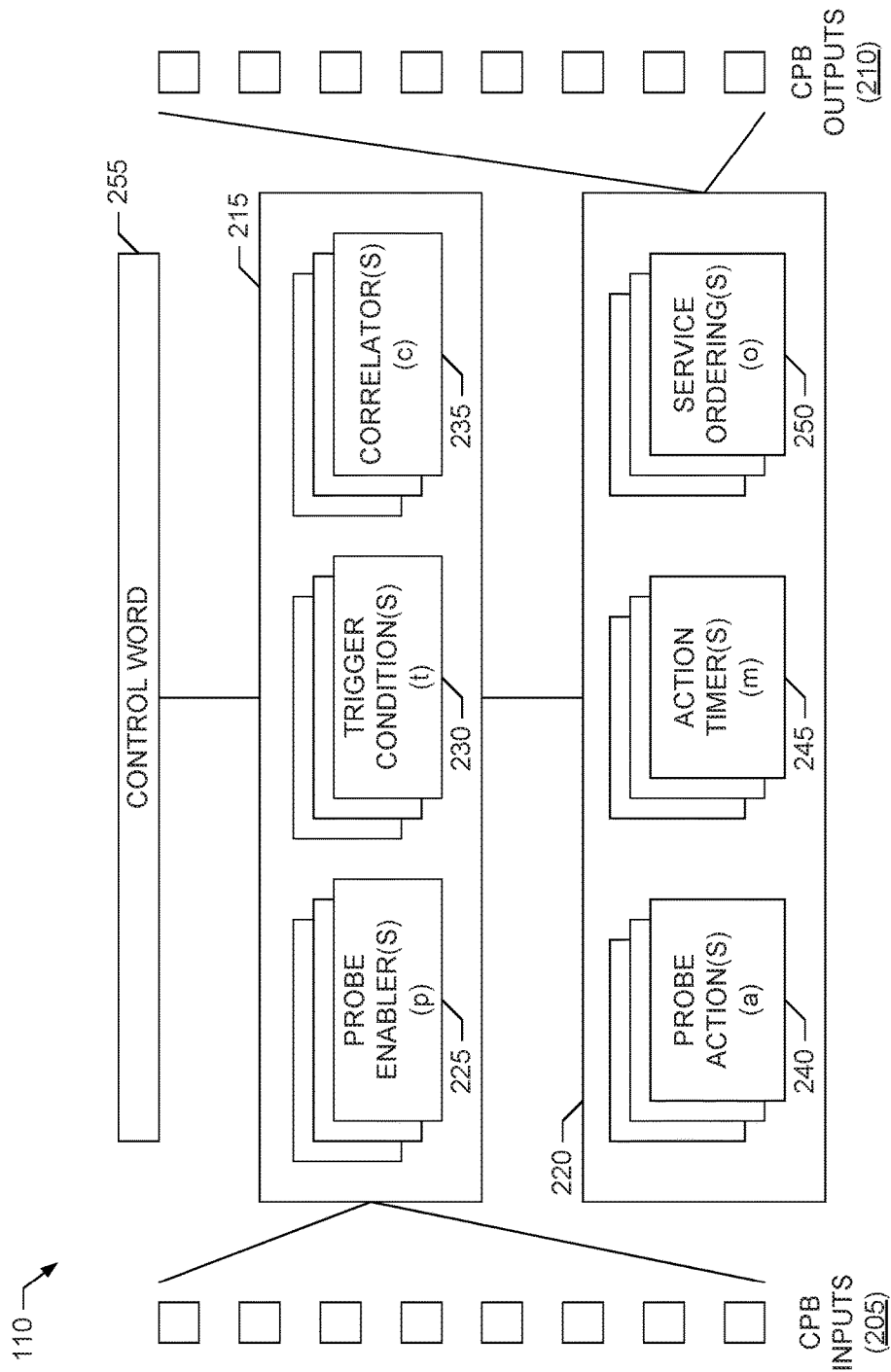
FIG. 2 is a block diagram of an example configurable probe block that may be used to implement the example monitoring system of FIG. 1.

A block diagram illustrating an example implementation of an example configurable probe block 110 of FIG. 1 is illustrated in FIG. 2. The example configurable probe block 110 of FIG. 2 includes an example set of available configurable probe block (CPB) inputs 205 and an example set of available CPB outputs 210. In the illustrated example of FIG. 2, the CPB input(s) 205 are mapped to or otherwise correspond to one or more respective I/O ports, memory mapped registers, memory addresses, etc., from which monitored data can be accessed. For example, the CPB input(s) 205 can be mapped to one or more respective I/O ports, memory mapped registers, memory addresses, etc., via (1) a configurable lookup table linking the CPB input(s) 205 to the I/O ports, memory mapped registers, memory addresses, etc., (2) digital interconnects, traces, etc., linking the CPB input(s) 205 to one or more respective I/O ports, memory mapped registers, memory addresses, etc., (3) a combination of configurable base and offset registers, memory locations, etc., similar to those used to implement memory maps, etc. Similarly, in the illustrated example of FIG. 2, the CPB output(s) 210 are mapped to and/or otherwise correspond to one or more respective I/O ports, memory mapped registers, memory addresses, etc., to which probe results can be written, stored, etc.

The example configurable probe block 110 of FIG. 2 also includes example CPB input operators 215 to operate on the set of available CPB inputs 205 (and/or data accessed thereby), and example CPB output operators 220 to determine probe results to be provided to the set of available CPB outputs 210. In the illustrated example of FIG. 2, the CPB input operators 215 include, but are not limited to, one or more of an example set of available probe enabler(s) 225, an example set of available trigger condition(s) 230 and an example set of available correlator operation(s) 235. The set of available probe enablers 225 may include a first number (e.g., corresponding to the letter "p" in FIG. 2, which may be greater than or equal to 1) of probe enablers 225, the set of available trigger conditions 230 may include a second number (e.g., corresponding to the letter "t" in FIG. 2, which may be greater than or equal to 1) of trigger conditions 230, and the set of available correlator operations 235 may include a third number (e.g., corresponding to the letter "c" in FIG. 2, which may be greater than or equal to 1) of correlator operations 235, where the first number (p), the second number (t) and the third number (c) may be the same or different. In the illustrated example of FIG. 2, the CPB output operators 220 include, but are not limited to, one or more of an example set of available probe action(s) 240, an example set of available action timer(s) 245 and an example set of possible service ordering(s) 250. The set of available probe actions 240 may include a fourth number (e.g., corresponding to the letter "a" in FIG. 2, which may be greater than or equal to 1) of probe actions 240, the set of available action timers 245 may include a fifth number (e.g., corresponding to the letter "m" in FIG. 2, which may be greater than or equal to 1) of action timers 245, and the set of possible service orderings 250 may include a sixth number (e.g., corresponding to the letter "o" in FIG. 2, which may be greater than or equal to 1) of possible service orderings 250, where the fourth number (a), the fifth number (m) and the sixth number (o) may be the same or different, and may be the same or different from the first number (p), the second number (t) and/or the third number (c).

In some examples, the probe enablers 225 included in the set of available probe enablers 225 are implemented by logic gates and/or logic operations (e.g., such as the logical AND operation) that can be configured to enable (e.g., pass) or disable (e.g., block) respective ones of the available CPB inputs 205. Additionally or alternatively, the probe enablers 225 may be implemented by electrically controlled switches, such as transistors, silicon-controlled rectifiers (SCRs), etc. In some examples, the trigger conditions 230 included in the set of available trigger conditions 230 are implemented by logic gates, electrically controlled switches and/or logic operations that can be assigned to CPB inputs 205 enabled by the probe enablers 225 to evaluate specified conditions using monitored data accessible via the enabled CPB inputs 205. (In some examples, if no trigger condition 230 is assigned to an enable CPB input 205, a virtual trigger associated that CPB input 205 is assumed to be satisfied continuously and the monitored data is always passed through from the corresponding input for further processing.) For example, one or more trigger conditions 230 in the set of available trigger conditions 230 may be implemented by logic causing the trigger conditions 230 to be satisfied (e.g., to evaluate to a logic TRUE value, a logic 1 value and/or some other value) when the monitored data accessible via a respective assigned CPB input 205 matches a particular type, a particular value, meets a threshold, etc. For example, in the context of monitoring network traffic, a first trigger condition 230 may be constructed to be satisfied when the monitored data corresponds to a first protocol type, whereas a second trigger condition 230 may be constructed to be satisfied when the monitored data corresponds to a second protocol type. As another example, in the context of system monitoring, a first trigger condition 230 may be constructed to be satisfied when the monitored data has a value that satisfies (e.g., exceeds, falls below, equals, etc.) a first threshold, whereas a second trigger condition 230 may be constructed to be satisfied when the monitored data has a value that satisfies a second threshold.

Additionally or alternatively, in some examples, one or more trigger conditions 230 in the set of available trigger conditions 230 may be implemented by logic causing the trigger conditions 230 to be satisfied (e.g., to evaluate to a logic TRUE value, a logic 1 value, an on state, and/or some other value) when the monitored data accessible via a respective assigned CPB input 205 exhibits a particular characteristic. For example, in the context of monitoring network traffic, a first trigger condition 230 may be constructed to be satisfied when the monitored data exhibits a first frequency of arrival, a first inter-arrival time, a first round trip delay, a first jitter, etc., whereas a second trigger condition 230 may be constructed to be satisfied when the monitored data exhibits a second frequency of arrival, a second inter-arrival time, a second round trip delay, a second jitter, etc. The first trigger condition 230 may, for example, provide an upper bound on a first parameter, and the second trigger condition 230 may, for example, provide a lower bound on the same parameter. Alternatively, the first and second trigger conditions 230 in such an example may be unrelated (e.g., may address different parameters). As another example, in the context of system monitoring, a first trigger condition 230 may be constructed to be satisfied when the monitored data exhibits a first variance, a first signal-to-noise ratio, etc., whereas a second trigger condition 230 may be constructed to be satisfied when the monitored data exhibits a second variance, a second signal-to-noise ratio, etc.

In some examples, the correlator operations 235 included in the set of available correlator operations 235 are implemented by logic gates, electrically controlled switches, and/or logic operations (e.g., such as logical AND and/or OR operations) that can be assigned to correlate and/or otherwise combine particular groups of enabled CPB inputs 205. In some such examples, a correlator operation 235 in the set of correlator operations 235 may be assigned to a particular combination of CPB inputs 205 to, for example, correlate results of processing performed by the trigger conditions 230 on their respective assigned CPB inputs 205. For example, a first correlator operation 235 in the set of available correlator operations 235 may be constructed to correlate the results of a first trigger condition 230 assigned to a first enabled CPB input 205 and a second trigger condition 230 assigned to a second enabled CPB input 205 using a logical AND operation that is satisfied (e.g., evaluates to a logic TRUE value, a logic 1 value, on, and/or some other value) when both the first trigger condition 230 and the second trigger condition 230 are satisfied, but is not satisfied otherwise. As another example, a second correlator operation 235 in the set of available correlator operations 235 may be constructed to correlate the results of a first trigger condition 230 assigned to a first enabled CPB input 205 and a second trigger condition 230 assigned to a second enabled CPB input 205 using a logical OR operation that is satisfied (e.g., evaluates to a logic TRUE value, a logic 1 value, on, and/or some other value) when either or both of the first trigger condition 230 and the second trigger condition 230 is/are satisfied, but is not satisfied otherwise.

In some examples, the probe actions 240 included in the set of available probe actions 240 are implemented by logic gates and/or other logic operations to perform different possible actions when a trigger condition 230 assigned to an enabled CPB input 205 is satisfied. For example, one or more of the probe actions 240 included in the set of available probe actions 240 may be constructed to output probe results (e.g., determined by processing the enabled probe input(s) 205 based on the assigned trigger condition(s) 230 and/or the assigned correlator operation(s) 235) to a particular one or more of the CPB outputs 210 (e.g., thereby enabling the particular one or more of the CPB outputs 210). Additionally or alternatively, in some examples, one or more of the probe actions 240 included in the set of available probe actions 240 may be constructed to cause probe results to be written and/or otherwise provided to an enabled CPB output 210 at a particular frequency, in a particular format, when a reporting threshold is met, etc. For example, a first probe action 240 may be structured to cause probe results to be written to an enabled CPB output 210 (e.g., that is also enabled by the first probe action 240 or by a different probe action 240) at a first frequency, when a first buffer threshold is met, etc., whereas a second probe action 240 may be structured to cause probe results to be written to an enabled CPB output 210 (e.g., that is also enabled by the second probe action 240 or by a different probe action 240) at a second frequency, when a second buffer threshold is met, etc.

In some examples, the action timers 245 included in the set of available action timers 245 are implemented by one or more timers, clocks, etc., that can be assigned to one or more of the probe actions 240. For example, different ones of the action timers 245 may include logic structured to cause the timer to be asserted (e.g., to evaluate to a logic TRUE value, a logic 1 value, on, and/or some other value) when different respective timer values are met. For example, a first action timer 245 may be constructed to be asserted every second, whereas a second action timer 245 may be constructed to be asserted every 10 seconds, whereas a third action timer 245 may be constructed to be asserted every minute, etc. Additionally or alternatively, in some examples, one or more of the action timers 245 may include logic structured to cause the timer to be asserted (e.g., to evaluate to a logic TRUE value, a logic 1 value, on, and/or some other value) at a particular time of day, on a particular day of the week, etc.

In some examples, the service orderings 250 included in the set of possible service orderings 250 specify different possible orderings for performing enabled actions 240. For example, a first service ordering 250 tailored for two actions may specify a first order for performing the two actions, whereas a second service ordering 250 tailored for two actions may specify a different second order (e.g., the opposite of the first order) for performing the two actions. As another example, a third service ordering 250 tailored for three actions may specify a first order for performing the three actions, whereas a fourth service ordering 250 tailored for three actions may specify a different (second) order for performing the three actions, whereas a fifth service ordering 250 tailored for three actions may specify yet another different (third) order for performing the three actions, etc.

In the illustrated example of FIG. 2, the configurable probe block 110 further includes an example control word 255 (also referred to as a probe behavior type code 255) to implement a particular configuration of the set of available CPB inputs 205, the set of available CPB outputs 210, the set of available probe enablers 225, the set of available trigger conditions 230, the set of correlator operations 235, the set of available probe actions 240, the set of available action timers 245 and/or the set of possible service orderings 250. In some such examples, different values of the control word 255 specify (e.g., map to) different possible configurations of the set of available CPB inputs 205, the set of available CPB outputs 210, the set of available probe enablers 225, the set of available trigger conditions 230, the set of correlator operations 235, the set of available probe actions 240, the set of available action timers 245 and/or the set of possible service orderings 250. For example, a first value of the control word 255 may assert a first probe enabler 225 to enable a first CPB input 205, assign a first trigger condition 230 to the first CPB input 205, assign a first action 240 to be performed on a result of the first trigger condition 230 assigned to the first CPB input 205 to cause a probe result to be written to a first CPB output 210, and assign a first action timer 245 to the first action 240. However, a second value of the control word 255, which is different from the first value, may assert a second probe enabler 225 to enable a second CPB input 205, assign a second trigger condition 230 to the second CPB input 205, assign a second action 240 to be performed on a result of the second trigger condition 230 assigned to the second CPB input 205 to cause a probe result to be written to a second CPB output 210, and assign a second action timer 245 to the second action 240. As yet another example, a third value of the control word 255, which is different from the first and second values, may assert the first probe enabler 225 to enable the first CPB input 205, assert the second probe enabler 225 to enable the second CPB input 205, assign the first trigger condition 230 to the first CPB input 205, assign the second trigger condition 230 to the second CPB input 205, assign a first correlator operation 235 to be performed on the results of the respective first and second trigger conditions being used to process the respective first and second CPB inputs 205, assign first and second actions 240 to be performed on the results of the respective first and second trigger conditions being used to process the respective first and second CPB inputs 205, assign a third action to be performed on the result of the assigned correlation operation 235, assign respective action timers 245 to the respective assigned actions 240, and assign a first service ordering 250 for performing the respective assigned actions 240. Other possible combinations of configuring the set of available CPB inputs 205, the set of available CPB outputs 210, the set of available probe enablers 225, the set of available trigger conditions 230, the set of correlator operations 235, the set of available probe actions 240, the set of available action timers 245 and/or the set of possible service orderings 250 can be mapped to other values of the control word 255 and are contemplated within the scope of this disclosure.

Figure 3:
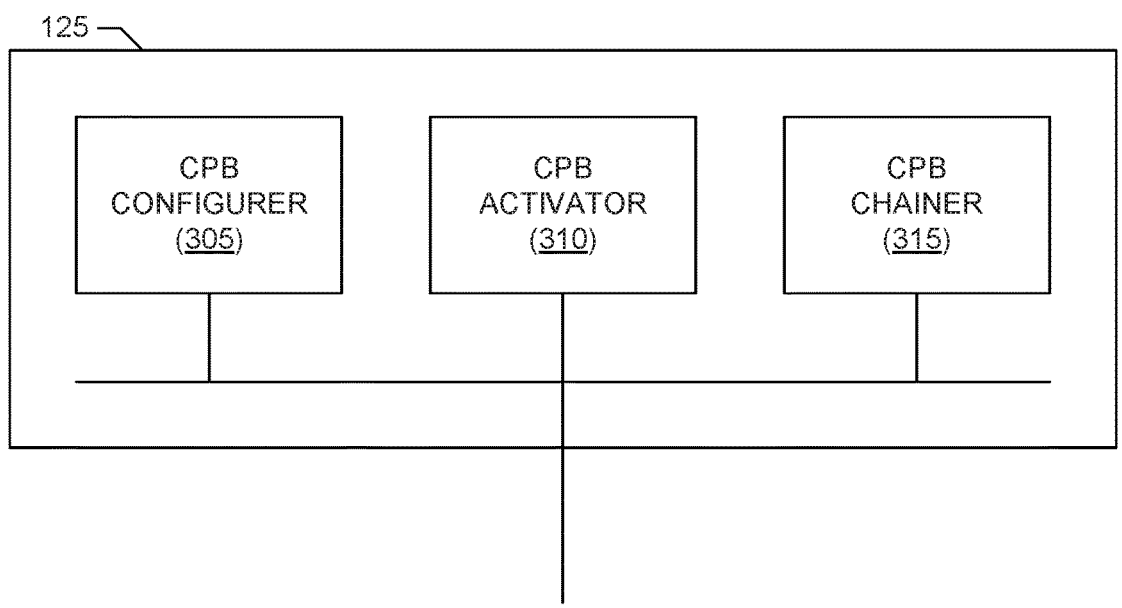
FIG. 3 is a block diagram of an example supervisor that may be used to implement the example monitoring system of FIG. 1.

A block diagram illustrating an example implementation of the example supervisor 125 of FIG. 1 is illustrated in FIG. 3. The example supervisor 125 of FIG. 3 includes an example CPB configurer 305 to configure the example configurable probe block(s) 110 included in the example monitoring system 105. For example, the CPB configurer 305 of FIG. 3 includes logic to permit one or more of the CPB inputs 205 of a configurable probe block 110 to be mapped to, or otherwise configured to be in communication with, one or more of the example data source(s) 115. For example, the CPB configurer 305 may include logic to map and/or otherwise communicatively couple CPB inputs 205 to respective memory addresses, memory-mapped registers, input/output (I/O) ports, etc., or any combination thereof, which correspond to the data source(s) 115 from which monitored data is to be accessed. The example CPB configurer 305 of FIG. 3 also includes logic to permit one or more of the CPB outputs 210 of the configurable probe block 110 to be mapped to, or otherwise configured to be in communication with, one or more of the example recipients (s) 120. For example, the CPB configurer 305 may include logic to map and/or otherwise communicatively couple at least some of (e.g., a subset of) the CPB outputs 210 to respective memory addresses, memory-mapped registers, input/output (I/O) ports, etc., or any combination thereof, which correspond to the recipient(s) 120 to which probe results is/are to be written (stored, etc.). In the illustrated example of FIG. 3, the CPB configurer 305 further includes a compiler to convert one or more keywords, user inputs, etc., to a corresponding value of the control word 255 to be used to specify a particular configuration of the configurable probe block 110. In some examples, the CPB configurations specified by the example CPB configurer 305 are programmable by a user, application, etc., via one or more of an application programming interface (API), a graphical user interface (GUI), etc.

The example supervisor 125 of FIG. 3 also includes an example CPB activator 310 to control operation of the example configurable probe block(s) 110 included in the example monitoring system 105. For example, the CPB activator 310 may include and/or otherwise have access to a first timer and include first logic to evaluate the first timer to implement a first trigger, control output, etc., capable of waking a particular configurable probe block 110 based on an activation schedule. Additionally or alternatively, the CPB activator 310 may include and/or otherwise have access to a second timer and include second logic to evaluate the second timer to implement a second trigger, second control output, etc., to implement a particular monitoring window, after which the configurable probe block 110 is placed in a sleep mode until being woken according to the activation schedule. In some examples, the operations performed by the by the example CPB activator 310 to control the configurable probe block(s) 110 are programmable by a user, application, etc., via one or more of an API, a GUI, etc. In some examples in which the monitoring system 105 has one or more available configurable probe block(s) 110 that is/are unused (e.g., that is/are not configured by the CPB configurer 305), the CPB activator 310 disables the unused configurable probe block(s) 110 (e.g., by affirmatively disabling the unused configurable probe block(s) 110 through a control input, by not including the unused configurable probe block(s) 110 in a control loop through which configurable probe block(s) 110 is/are activated, etc., or any combination thereof).

The example supervisor 125 of FIG. 3 further includes an example CPB chainer 315 to chain together multiple configurable probe blocks 110 included in the monitoring system 105 to implement more complex probing functionality. For example, the monitoring system 105 may include two or more (e.g., 5, 10, 100 or some other number of) configurable probe blocks 110, which may be configured to operate independently, which may be chained together, and/or which may be configured in some combination thereof. In some such examples, to chain multiple configurable probe blocks 110 together, the CPB chainer 315 of FIG. 3 includes logic to map and/or otherwise configure the probe output(s) (e.g., the CPB output(s) 210) of configurable probe block(s) 110 earlier in a chain to be in communication (e.g., via configured I/O ports, memory addresses, memory mapped registers, etc.) with probe input(s) (e.g., the CPB input(s) 205) of configurable probe block(s) 110 later in the chain. In some examples, the CPB chainer 315 of FIG. 3 includes control logic to operate the configurable probe blocks 110 included in the chain in a particular manner, such as in series, in parallel, in control loops, etc. In some examples, the CPB chainer 315 of FIG. 3 includes control logic to condition the operation of (e.g., by conditioning activation of) one or more configurable probe blocks 110 in the chain based on conditional control statements (e.g., such as if-then-else statements). In some examples, the operations performed by the example CPB chainer 315 to chain together multiple configurable probe block(s) 110 are programmable by a user, application, etc., via one or more of an API, a GUI, etc.

Figure 4:
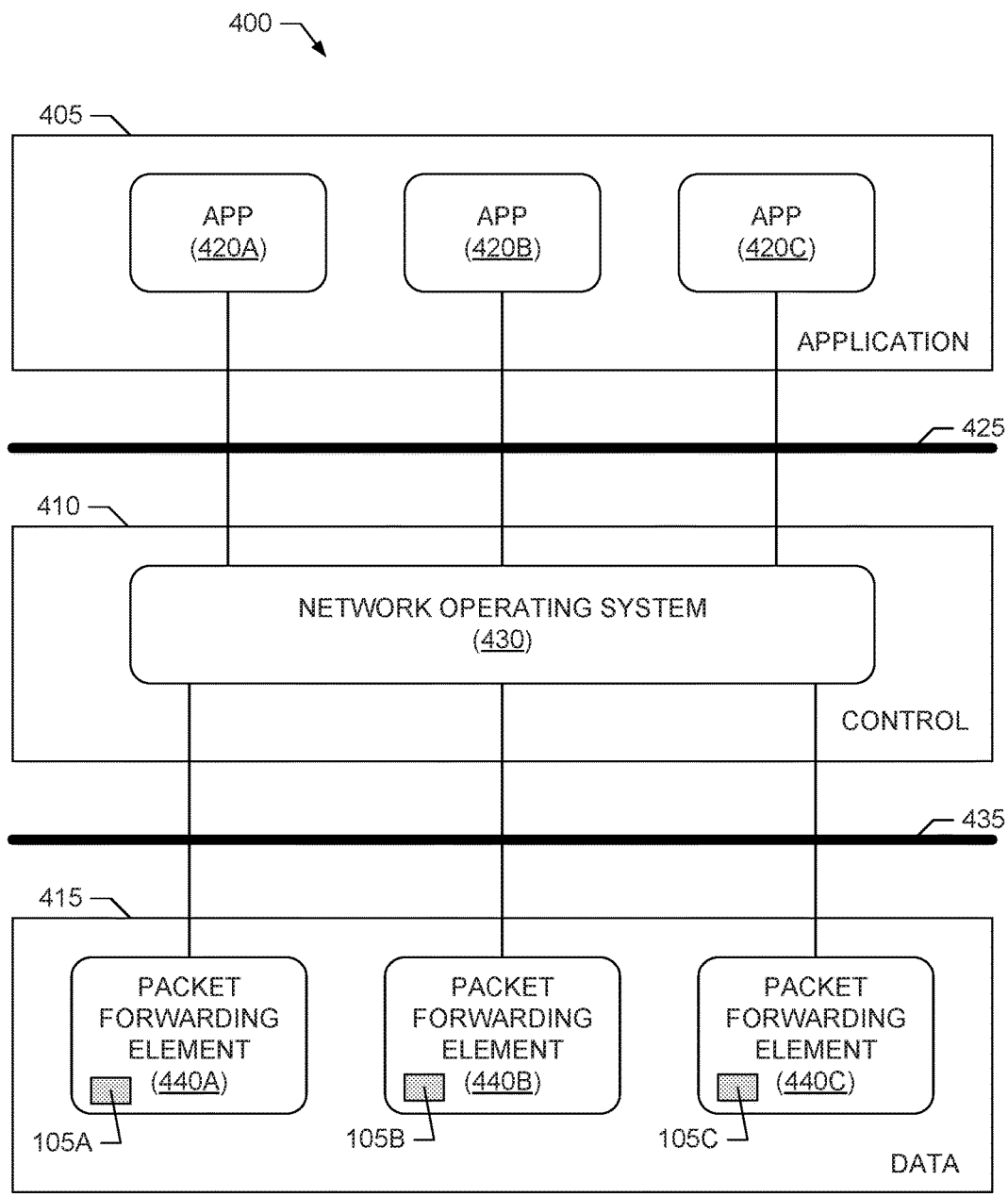
FIG. 4 is a second example environment of use for an example monitoring system including configurable probe blocks implemented in accordance with the teachings of this disclosure.

A block diagram of a second example environment of use 400 for the example monitoring system 105, which includes the example configurable probe block(s) 110 and the example supervisor 125 implemented in accordance with the teachings of this disclosure, is illustrated in FIG. 4. The second example environment of use 400 corresponds to an example software defined network (SDN) 400 in which the monitoring system 105 is employed to provide visibility into network operations. The example SDN 400 of FIG. 4 includes three example logical planes, namely, an example application plane 405, an example control plane 410 and an example data plane 415. The example application plane 405 includes one or more example applications 420A-C that utilize the capabilities of the SDN 400 to provide functionality to one or more users/subscribers, operators, etc. For example, the applications 420A-C may include, but are not limited to, voice over Internet protocol (VoIP) applications, video applications, mobility applications, billing applications, ordering applications, management applications, etc.

In the example SDN 400 of FIG. 4, the applications 420A-C in the application plane 405 communicate with the control plane 410 via an example northbound application programming interface (API) 425. For example, the northbound API 425 enables the applications 420A-C to communicate their respective network requirements and receive network visibility information (e.g., statistics, events, etc.) from an example network operating system (OS) 430 included in the control plane 410. In the illustrated example of FIG. 4, the network OS 430 is responsible for implementing network control and routing functionality based on requirements provided by the application plane 405, and for providing network visibility information to the application plane 405.

In the example SDN 400 of FIG. 4, the network OS 430 communicates with the data plane 415 via an example southbound API 435. For example, the southbound API 435 enables the network OS 430 to control operation of one or more example packet forwarding elements 440A-C. In the illustrated example of FIG. 4, the packet forwarding elements 440A-C are responsible for processing and forwarding data to destinations in the example SDN 400 under the control of the example network OS 430.

In the example SDN 400, to provide monitoring capability in accordance with the teachings of this disclosure, the packet forwarding elements 440A-C include (e.g., implement and/or are associated with) respective instances of the example monitoring system 105, which are labeled 105A-C in FIG. 4. In the illustrated example of FIG. 4, the one or more applications 420A-C specify network observability requirements to the network OS 430. The network OS 430, in turn, programs the monitoring systems 105A-C to provide such observability by programming the respective supervisors 125 included in the monitoring systems 105A-C to cause the respective configurable probe block(s) 110 included in the monitoring systems 105A-C to access data to be monitored and return corresponding probe results in accordance with the network observability requirements specified by the applications 420A-C. For example, the network OS 430 may receive the network observability requirements from the one or more applications 420A-C in the form of control messages, instructions, etc. The example network OS 430 may include one or more compilers, message/instruction processors, etc., to convert the received messages/instructions to keywords, inputs, etc., capable of being compiled by the respective supervisors 125 into the appropriate control words 255 capable of configuring the respective configurable probe block(s) 110 to satisfy the specified network observability requirements.

Figure 5:
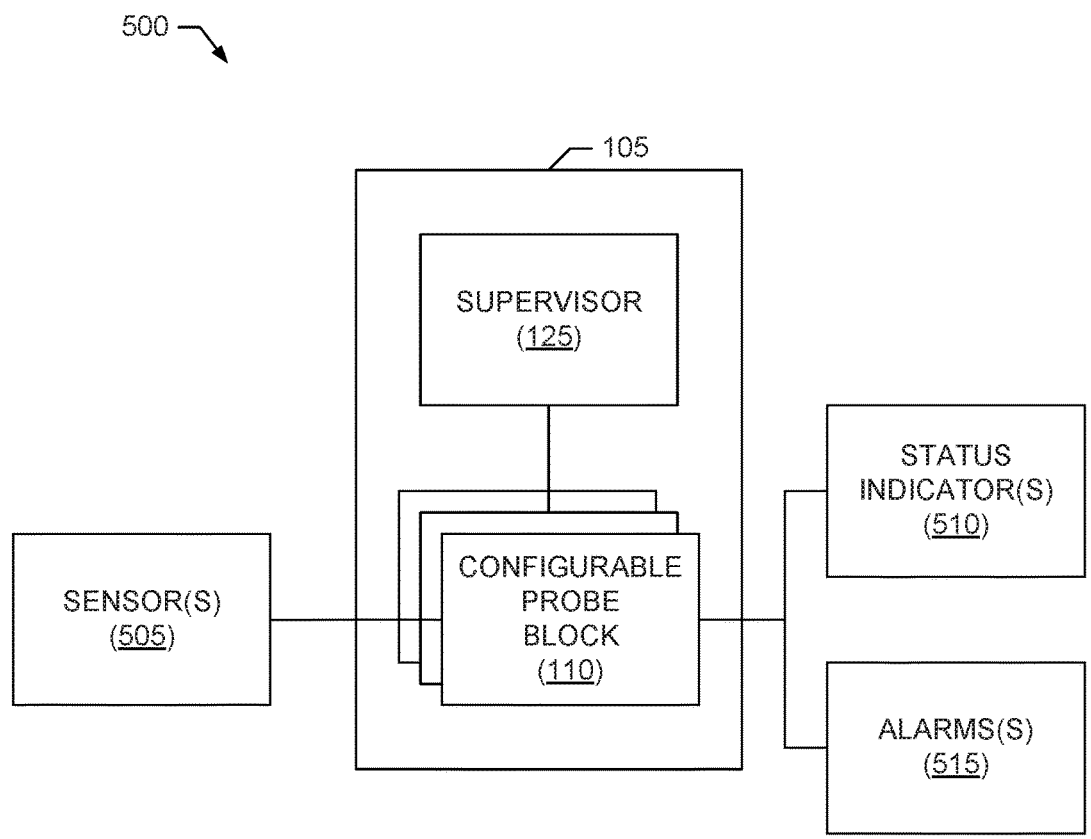
FIG. 5 is a third example environment of use for an example monitoring system including configurable probe blocks implemented in accordance with the teachings of this disclosure.

A block diagram of a third example environment of use 500 for the example monitoring system 105, which includes the example configurable probe block(s) 110 and the example supervisor 125 implemented in accordance with the teachings of this disclosure, is illustrated in FIG. 5. The second example environment of use 500 corresponds to an example end-user system 500 in which the monitoring system 105 is employed to monitor system operation. In the illustrated example of FIG. 5, the monitoring system 105 is configured to monitor data provided by one or more example sensors 505 (which correspond to the example data source(s) 115 of FIG. 1). The example sensor(s) 505 can be implemented by any type(s) and/or number(s) of sensors, meters, etc., such as one or more acoustic sensors, optical sensors, vibration sensors, fluid level sensors, voltage meters, current meters, vacuum sensors, etc., or any combination thereof. In the illustrated example of FIG. 5, the supervisor 125 configures the configurable probe block(s) 110, as disclosed above, to monitor the data provided by the sensor(s) and provide corresponding probe results to one or more example status indicators 510, one or more example alarms 515, etc. (which correspond to the example recipients(s) 120 of FIG. 1.) For example, the status indicators 510 can be implemented by any type(s) and/or number(s) of indicators, such as one or more visual indicators (e.g., lights, gauges, displays, etc.), one or more audible indicators, etc. Similarly, the example alarms 515 can be implemented by any type(s) and/or number(s) of alarms, such as one or more visual alarms (e.g., lights, gauges, displays, etc.), one or more audible alarms, etc.

While example manners of implementing the monitoring system 105 are illustrated in FIGS. 1-5, one or more of the elements, processes and/or devices illustrated in FIGS. 1-5 may be combined, divided, re-arranged, omitted, eliminated and/or implemented in any other way. Further, the example configurable probe block(s) 110, the example data source(s) 115, the example recipient(s) 120, the example supervisor 125, the example CPB input(s) 205, the example CPB output(s) 210, the example CPB input operators 215, the example CPB output operators 220, the example set of available probe enablers 225, the example set of available trigger conditions 230, the example set of correlator operations 235, the example set of available probe actions 240, the example set of available action timers 245, the example set of possible service orderings 250, the example control word 255, the example CPB configurer 305, the example CPB activator 310, the example CPB chainer 315 and/or, more generally, the example monitoring system 105 of FIGS. 1-5 may be implemented by hardware, software, firmware and/or any combination of hardware, software and/or firmware. Thus, for example, any of the example configurable probe block(s) 110, the example data source(s) 115, the example recipient(s) 120, the example supervisor 125, the example CPB input(s) 205, the example CPB output(s) 210, the example CPB input operators 215, the example CPB output operators 220, the example set of available probe enablers 225, the example set of available trigger conditions 230, the example set of correlator operations 235, the example set of available probe actions 240, the example set of available action timers 245, the example set of possible service orderings 250, the example control word 255, the example CPB configurer 305, the example CPB activator 310, the example CPB chainer 315 and/or, more generally, the example monitoring system 105 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example monitoring system 105, the example configurable probe block(s) 110, the example data source(s) 115, the example recipient(s) 120, the example supervisor 125, the example CPB input(s) 205, the example CPB output(s) 210, the example CPB input operators 215, the example CPB output operators 220, the example set of available probe enablers 225, the example set of available trigger conditions 230, the example set of correlator operations 235, the example set of available probe actions 240, the example set of available action timers 245, the example set of possible service orderings 250, the example control word 255, the example CPB configurer 305, the example CPB activator 310 and/or the example CPB chainer 315 is/are hereby expressly defined to include a tangible computer readable storage device or storage disk such as a memory, a digital versatile disk (DVD), a compact disk (CD), a Blu-ray disk, etc. storing the software and/or firmware. Further still, the example monitoring system 105 may include one or more elements, processes and/or devices in addition to, or instead of, those illustrated in FIGS. 1-5, and/or may include more than one of any or all of the illustrated elements, processes and devices.

Figure 6:
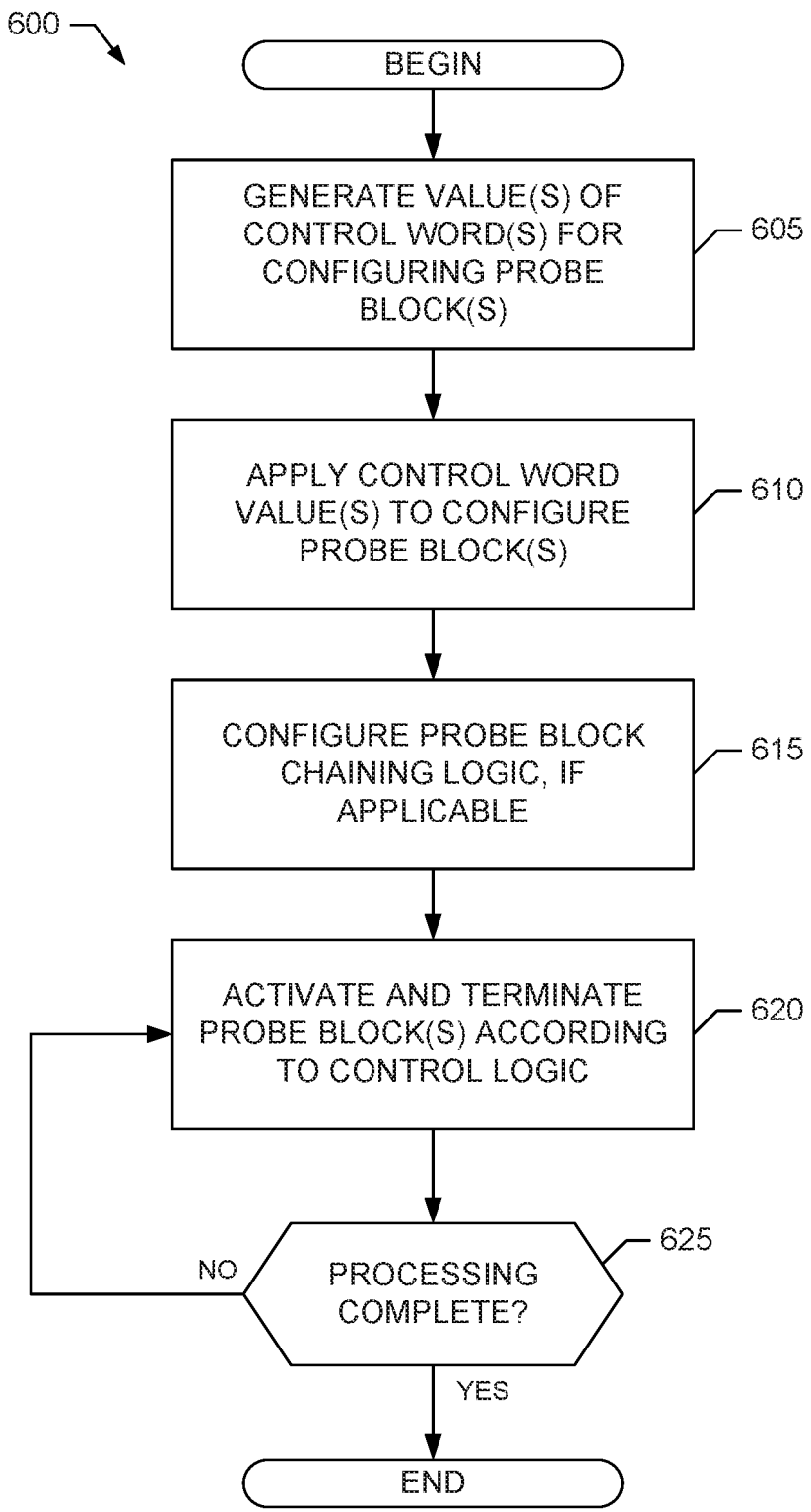
FIG. 6 is a flowchart representative of example machine readable instructions that may be executed to implement the example supervisor of FIGS. 1 and/or 3.
Figure 7A:
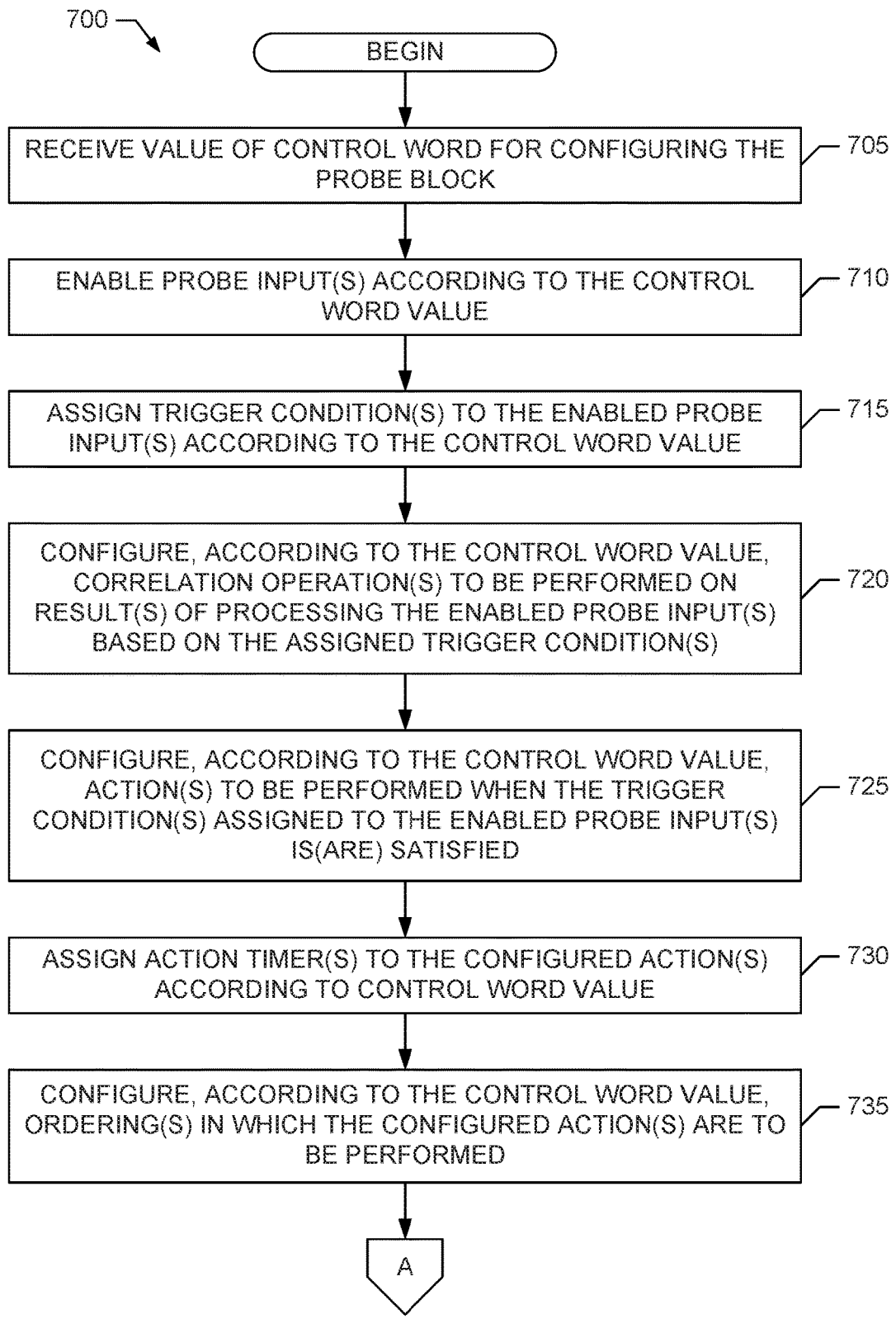
FIGS. 7A-7B collectively form a flowchart representative of example machine readable instructions that may be executed to implement the example configurable probe block(s) of FIGS. 1 and/or 2.
Figure 7B:
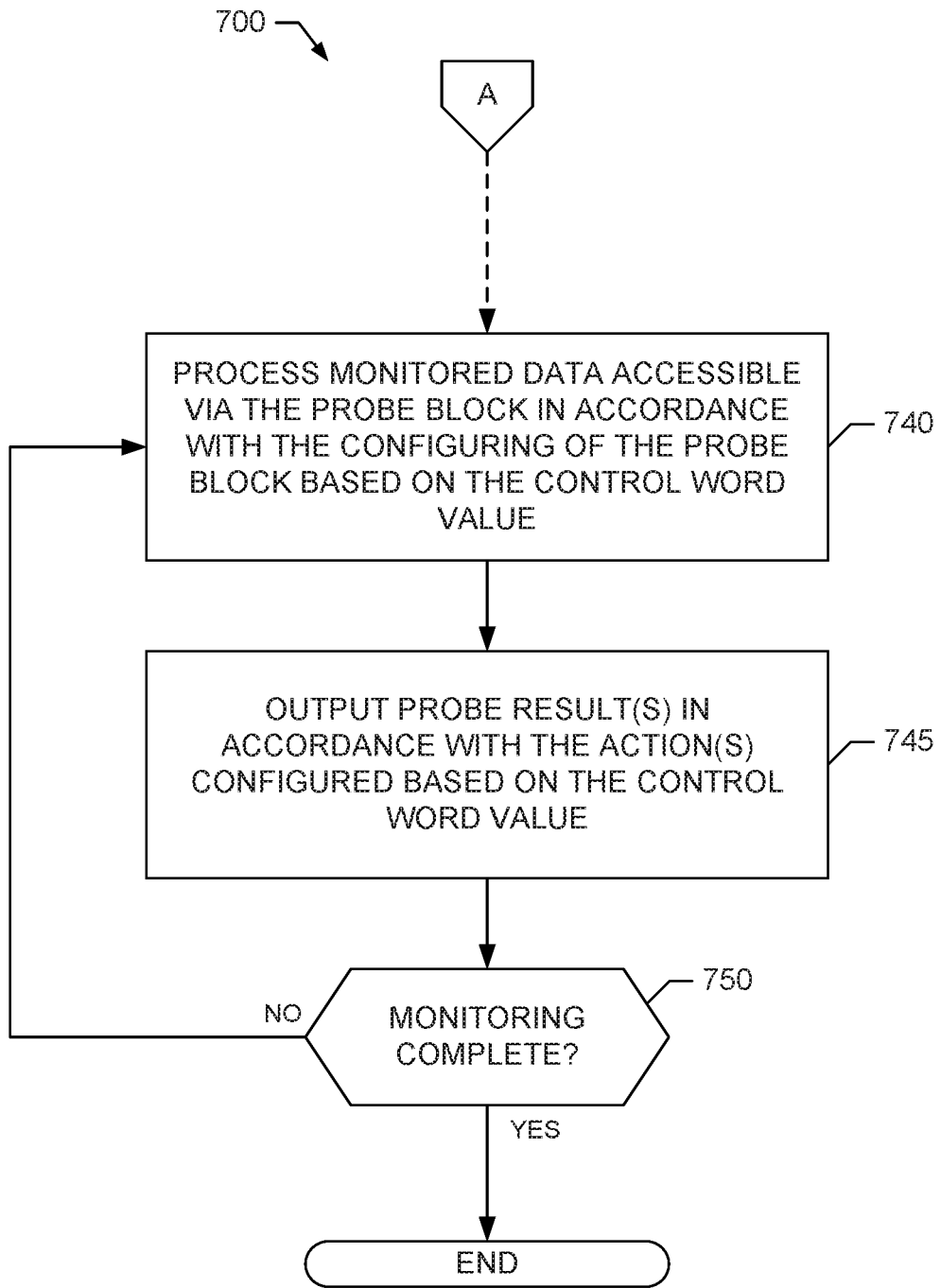

Flowcharts representative of example machine readable instructions for implementing the example monitoring system 105, the example configurable probe block(s) 110, the example data source(s) 115, the example recipient(s) 120, the example supervisor 125, the example CPB input(s) 205, the example CPB output(s) 210, the example CPB input operators 215, the example CPB output operators 220, the example set of available probe enablers 225, the example set of available trigger conditions 230, the example set of correlator operations 235, the example set of available probe actions 240, the example set of available action timers 245, the example set of possible service orderings 250, the example control word 255, the example CPB configurer 305, the example CPB activator 310 and/or the example CPB chainer 315 are shown in FIGS. 6 and 7A-B. In these examples, the machine readable instructions comprise one or more programs for execution by a processor, such as the processor 812 shown in the example processor platform 800 discussed below in connection with FIG. 8. The one or more programs, or portion(s) thereof, may be embodied in software stored on a tangible computer readable storage medium such as a CD-ROM, a floppy disk, a hard drive, a digital versatile disk (DVD), a Blu-ray Disk™, or a memory associated with the processor 812, but the entire program or programs and/or portions thereof could alternatively be executed by a device other than the processor 812 and/or embodied in firmware or dedicated hardware (e.g., implemented by an ASIC, a PLD, an FPLD, discrete logic, etc.). Further, although the example program(s) is(are) described with reference to the flowcharts illustrated in FIGS. 6 and 7A-B, many other methods of implementing the example monitoring system 105, the example configurable probe block(s) 110, the example data source(s) 115, the example recipient(s) 120, the example supervisor 125, the example CPB input(s) 205, the example CPB output(s) 210, the example CPB input operators 215, the example CPB output operators 220, the example set of available probe enablers 225, the example set of available trigger conditions 230, the example set of correlator operations 235, the example set of available probe actions 240, the example set of available action timers 245, the example set of possible service orderings 250, the example control word 255, the example CPB configurer 305, the example CPB activator 310 and/or the example CPB chainer 315 may alternatively be used. For example, with reference to the flowcharts illustrated in FIGS. 6 and 7A-B, the order of execution of the blocks may be changed, and/or some of the blocks described may be changed, eliminated, combined and/or subdivided into multiple blocks.

As mentioned above, the example processes of FIGS. 6 and 7A-B may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIGS. 6 and 7A-B may be implemented using coded instructions (e.g., computer and/or machine readable instructions) stored on a non-transitory computer and/or machine readable medium such as a hard disk drive, a flash memory, a ROM, a CD, a DVD, a cache, a RAM and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended. Also, as used herein, the terms "computer readable" and "machine readable" are considered equivalent unless indicated otherwise.

An example program 600 that may be executed to implement an example supervisor 125 included in the example monitoring system 105 is represented by the flowchart shown in FIG. 6. With reference to the preceding figures and associated written descriptions, the example program 600 of FIG. 6 begins execution at block 605 at which the example CPB configurer 305 of the example supervisor 125 generates value(s) of control word(s) to be used to configure the configurable probe block(s) 110 included in the monitoring system 105, as disclosed above. At block 610, the CPB configurer 305 provides the control word values(s) to the control word(s) 255 of the configurable probe block(s) 110 to be configured, as disclosed above. At block 615, the example CPB chainer 315 of the example supervisor 125 configures chaining logic, if applicable, to chain together multiple configurable probe blocks 110 to implement more complex probe functionality, as disclosed above. At block 620, the example CPB activator 310 of the example supervisor 125 controls activation and termination of the configurable probe block(s) 110 included in the monitoring system 105, as disclosed above. At block 625, the supervisor 125 determines whether operation of the configurable probe block(s) 110 to monitor data is to continue. If operation is to continue (block 625), control returns to block 620. Otherwise, execution of the example program 600 ends.

An example program 700 that may be executed to implement the example configurable probe block 110 included in the example monitoring system 105 is represented by the flowchart shown in FIGS. 7A-B. With reference to the preceding figures and associated written descriptions, the example program 700 of FIGS. 7A-B begins execution at block 705 of FIG. 7A at which the example control word 255 of the example configurable probe block 110 receives a control word value from the example supervisor 125, as described above. At block 710, respective one(s) of the probe enabler(s) 225 are configured in accordance with the value of the control word 255 to enable the appropriate CPB input(s) 205, as described above. At block 715, respective one(s), if any, of the available trigger condition(s) 230 are assigned, in accordance with the value of the control word 255, to the CPB input(s) 205 enabled by the probe enabler(s) 225, as disclosed above. At block 720, respective one(s), if any, of the available correlator operation(s) 235 are configured, in accordance with the value of the control word 255, to be performed on the result(s) of processing the CPB input(s) 205 enabled by the probe enabler(s) 225 with the assigned trigger condition(s) 230, as disclosed above. At block 725, respective one(s), if any, of the available probe action(s) 240 are configured, in accordance with the value of the control word 255, to be performed when the trigger condition(s) 230 assigned to the CPB input(s) 205 enabled by the probe enabler(s) 225 are satisfied, as disclosed above. At block 730, respective one(s) of the available action timer(s) 245 are assigned to the configured probe action(s) accordance with the value of the control word 255, as disclosed above. At block 735, respective one(s) of the possible service ordering(s) 250 are configured, in accordance with the value of the control word 255, to control the ordering in which the configured probe action(s) 240 are performed, as disclosed above.

Sometime thereafter, at block 740 of FIG. 7B, the configurable probe block 110 is activated (e.g., by the supervisor 125) and processes, as disclosed above, monitored data (e.g., from the data source(s) 115), which is accessible at the configurable probe block 110, in accordance with the configuration performed at blocks 705-735 based on the value of the control word 255. At block 745, the configurable probe block 110 outputs probe result(s) to the appropriate CPB output(s) 210 in accordance with the probe action(s) configured based on the value of the control word 255, as disclosed above. At block 750, the configurable probe block 110 determines whether data monitoring has been terminated (e.g., by the supervisor 125). If data monitoring has not been terminated (block 750), control returns to block 740. Otherwise, execution of the example program 700 ends.

Figure 8:
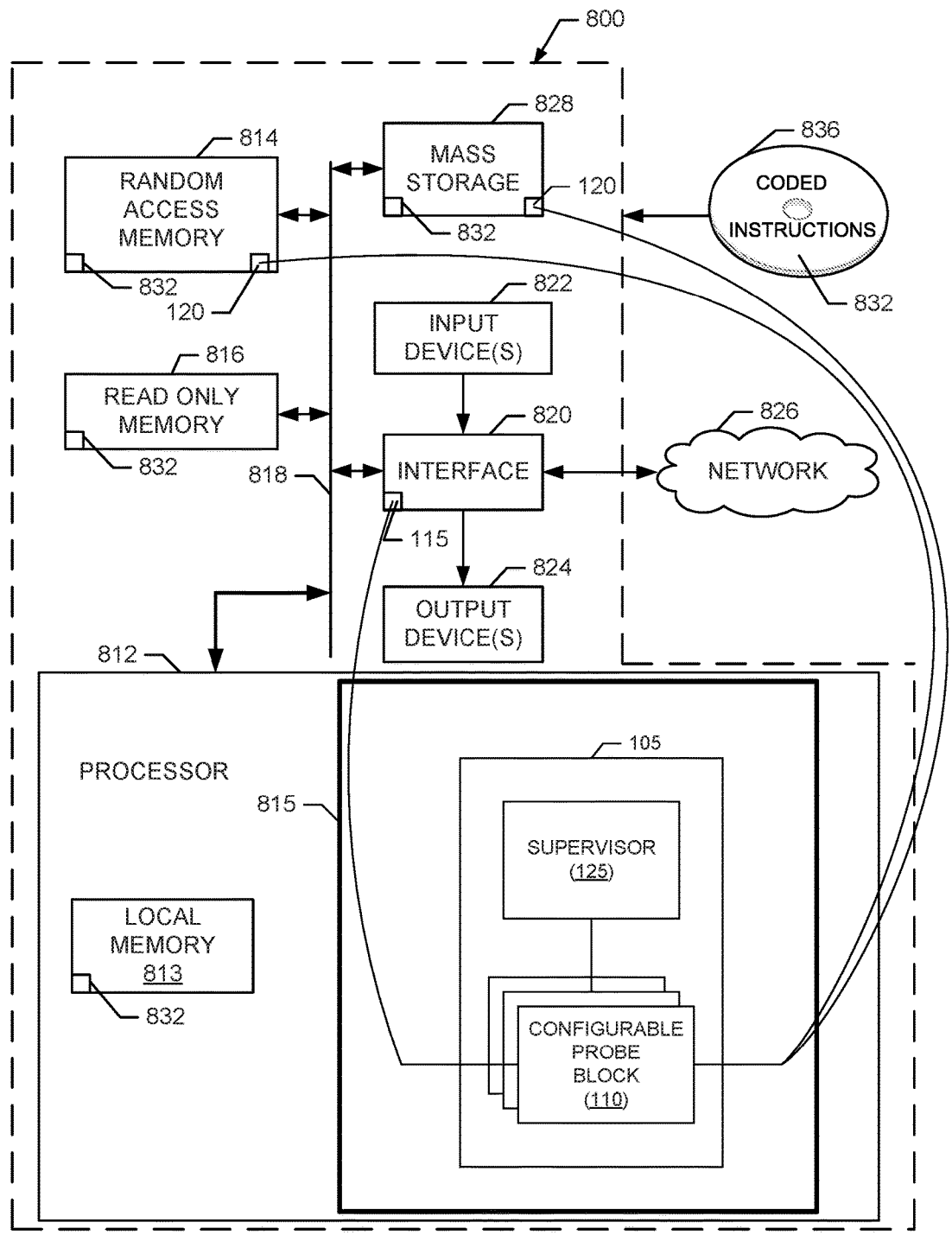
FIG. 8 is a block diagram of an example processor platform structured to execute the example machine readable instructions of FIGS. 6 and/or 7A-7B to implement the example monitoring system of FIG. 1, the example configurable probe block of FIGS. 1 and/or 2, and/or the example supervisor of FIGS. 1 and/or 3.

FIG. 8 is a block diagram of an example processor platform 800 structured to execute the instructions of FIGS. 6 and/or 7A-B to implement the example monitoring system 105, which includes the example configurable probe block(s) 110, the example data source(s) 115, the example recipient(s) 120 and the example supervisor 125 of FIGS. 1-5, in another example environment of use. The processor platform 800 can be, for example, a server, a personal computer, a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box a digital camera, or any other type of computing device.

The processor platform 800 of the illustrated example includes a processor 812. The processor 812 of the illustrated example is hardware. For example, the processor 812 can be implemented by one or more integrated circuits, logic circuits, microprocessors or controllers from any desired family or manufacturer. In the illustrated example of FIG. 8, the processor 812 includes one or more example processing cores 815 configured via example instructions 832, which include the example instructions of FIGS. 6 and/or 7A-B, to implement the example configurable probe block(s) 110, which may include the example CPB input(s) 205, the example CPB output(s) 210, the example CPB input operators 215, the example CPB output operators 220, the example set of available probe enablers 225, the example set of available trigger conditions 230, the example set of correlator operations 235, the example set of available probe actions 240, the example set of available action timers 245, the example set of possible service orderings 250 and/or the example control word 255, and to implement the example supervisor 125, which may include the example CPB configurer 305, the example CPB activator 310 and/or the example CPB chainer 315, of the example monitoring system 105 of FIGS. 1-5.

The processor 812 of the illustrated example includes a local memory 813 (e.g., a cache). The processor 812 of the illustrated example is in communication with a main memory including a volatile memory 814 and a non-volatile memory 816 via a link 818. The link 818 may be implemented by a bus, one or more point-to-point connections, etc., or a combination thereof. The volatile memory 814 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 816 may be implemented by flash memory and/or any other desired type of memory device. Access to the main memory 814, 816 is controlled by a memory controller.

The processor platform 800 of the illustrated example also includes an interface circuit 820. The interface circuit 820 may be implemented by any type of interface standard, such as an Ethernet interface, a universal serial bus (USB), and/or a PCI express interface.

In the illustrated example, one or more input devices 822 are connected to the interface circuit 820. The input device(s) 822 permit(s) a user to enter data and commands into the processor 812. The input device(s) can be implemented by, for example, an audio sensor, a microphone, a camera (still or video), a keyboard, a button, a mouse, a touchscreen, a track-pad, a trackball, a trackbar (such as an isopoint), a voice recognition system and/or any other human-machine interface. Also, many systems, such as the processor platform 800, can allow the user to control the computer system and provide data to the computer using physical gestures, such as, but not limited to, hand or body movements, facial expressions, and face recognition.

One or more output devices 824 are also connected to the interface circuit 820 of the illustrated example. The output devices 824 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 820 of the illustrated example, thus, typically includes a graphics driver card, a graphics driver chip or a graphics driver processor.

The interface circuit 820 of the illustrated example also includes a communication device such as a transmitter, a receiver, a transceiver, a modem and/or network interface card to facilitate exchange of data with external machines (e.g., computing devices of any kind) via a network 826 (e.g., an Ethernet connection, a digital subscriber line (DSL), a telephone line, coaxial cable, a cellular telephone system, etc.). In the illustrated example of FIG. 8, the interface circuit 820 is also structured to implement and/or provide access to the example data source(s) 115.

The processor platform 800 of the illustrated example also includes one or more mass storage devices 828 for storing software and/or data. Examples of such mass storage devices 828 include floppy disk drives, hard drive disks, compact disk drives, Blu-ray disk drives, RAID (redundant array of independent disks) systems, and digital versatile disk (DVD) drives. In some examples, the mass storage device 828 may implement the example recipient(s) 120. Additionally or alternatively, in some examples the volatile memory 814 may implement the example recipient(s) 120.

Coded instructions 832 corresponding to the instructions of FIGS. 6 and/or 7A-B may be stored in the mass storage device 828, in the volatile memory 814, in the non-volatile memory 816, in the local memory 813 and/or on a removable tangible computer readable storage medium, such as a CD or DVD 836.

Example configurable probe blocks for system and/or device monitoring have been disclosed. As disclosed above, such configurable probe blocks can be embedded as hardware blocks (e.g., as hardware logic implemented in the interconnect fabric of an SoC device) and/or as software/firmware blocks (e.g., as software functions, methods, etc.) in systems to be monitored. Also, example configurable probe blocks disclosed herein can provide a host of different probing functionality that is configurable to implement a specific probing application. Furthermore, example configurable probe blocks can be chained, as disclosed above, to perform more complex probing functions, such as real-time protocol analysis and/or flow/protocol decoding, real-time capturing and correlation of sensed data from traffic flows and/or equipment behaviors, etc. In some examples, different configurable probe blocks are specified/defined for different industries, and such configurable probe blocks are standardized for inclusion in devices, systems, etc., targeted to those industries. For example, different trigger conditions 230, correlator operations 235, probe actions 240, action timers 245, service orderings 250, control words 255, CPB configurers 305, CPB activators 310 and/or CPB chainers 315 can be constructed to different probing functionality targeted to different industries. Open application programming interface(s) can also be specified/implemented to enable standardized configuration of such example configurable probe blocks.

At least some of the above described example methods and/or apparatus are implemented by one or more software and/or firmware programs running on a computer processor. However, dedicated hardware implementations including, but not limited to, application specific integrated circuits, programmable logic arrays and/or other hardware devices can likewise be constructed to implement some or all of the example methods and/or apparatus disclosed herein, either in whole or in part. Furthermore, alternative software implementations including, but not limited to, distributed processing or component/object distributed processing, parallel processing, or virtual machine processing can also be constructed to implement the example methods and/or apparatus disclosed herein.

To the extent the above specification describes example components and functions with reference to particular standards and protocols, it is understood that the scope of this patent is not limited to such standards and protocols. For instance, each of the standards for Internet and other packet switched network transmission (e.g., Transmission Control Protocol (TCP)/Internet Protocol (IP), User Datagram Protocol (UDP)/IP, HyperText Markup Language (HTML), HyperText Transfer Protocol (HTTP)) represent examples of the current state of the art. Such standards are periodically superseded by faster or more efficient equivalents having similar functionality. Accordingly, replacement standards and protocols having the same functions are equivalents which are contemplated by this patent and are intended to be included within the scope of the accompanying claims.

Additionally, although this patent discloses example systems including software or firmware executed on hardware, it should be noted that such systems are merely illustrative and should not be considered as limiting. For example, it is contemplated that any or all of these hardware and software components could be embodied exclusively in hardware, exclusively in software, exclusively in firmware or in some combination of hardware, firmware and/or software. Accordingly, while the above specification described example systems, methods and articles of manufacture, the examples are not the only way to implement such systems, methods and articles of manufacture. Therefore, although certain example methods, apparatus and articles of manufacture have been disclosed herein, the scope of coverage of this patent is not limited thereto. On the contrary, this patent covers all methods, apparatus and articles of manufacture fairly falling within the scope of the claims either literally or under the doctrine of equivalents.

What is claimed is:

1. An apparatus to monitor a software defined network, the apparatus comprising:
   memory including computer readable instructions; and
   a processor to execute the computer readable instructions to perform operations including:
      enabling, based on a value of a control word, a first probe input of a set of probe inputs of a probe block, the first probe input mapped to a source of monitored network traffic in the software defined network;
      configuring, based on the value of the control word, a first trigger condition of a set of trigger conditions of the probe block to evaluate the monitored network traffic accessible via the first probe input to determine whether the monitored network traffic has a first characteristic; and
      configuring, based on the value of the control word, a first probe output of a set of probe outputs of the probe block to output a result of the monitored network traffic being evaluated according to the first trigger condition, the first probe output to output the result to a network application of the software defined network.

2. The apparatus of claim 1, wherein the first probe input is mapped to the source of the monitored network traffic via a configurable lookup table.

3. The apparatus of claim 1, wherein the enabling of the first probe input includes configuring at least one of logic gates, logic operations or switches to pass or block the first probe input based on the value of the control word.

4. The apparatus of claim 1, wherein the probe block is included in a device in a data plane of the software defined network, and the network application is included in an application plane of the software defined network.

5. The apparatus of claim 4, wherein the operations further include compiling input data into the value of the control word, the input data corresponding to a network observability requirement specified by the network application.

6. The apparatus of claim 1, wherein the operations further include configuring, based on the value of the control word, a second trigger condition of the set of trigger conditions of the probe block to evaluate the monitored network traffic accessible via the first probe input to determine whether the monitored network traffic has the first characteristic.

7. The apparatus of claim 6, wherein the first trigger condition provides an upper bound on a parameter associated with the first characteristic, and the second trigger condition provides a lower bound on the parameter associated with the first characteristic.

8. A non-transitory computer readable medium comprising computer readable instructions which, when executed, cause a processor to perform operations comprising:
   enabling, based on a value of a control word, a first probe input of a set of probe inputs of a probe block, the first probe input mapped to a source of monitored network traffic in a software defined network;
   configuring, based on the value of the control word, a first trigger condition of a set of trigger conditions of the probe block to evaluate the monitored network traffic accessible via the first probe input to determine whether the monitored network traffic has a first characteristic; and
   configuring, based on the value of the control word, a first probe output of a set of probe outputs of the probe block to output a result of the monitored network traffic being evaluated according to the first trigger condition, the first probe output to output the result to a network application of the software defined network.

9. The non-transitory computer readable medium of claim 8, wherein the first probe input is mapped to the source of the monitored network traffic via a configurable lookup table.

10. The non-transitory computer readable medium of claim 8, wherein the enabling of the first probe input includes configuring at least one of logic gates, logic operations or switches to pass or block the first probe input based on the value of the control word.

11. The non-transitory computer readable medium of claim 8, wherein the probe block is included in a device in a data plane of the software defined network, and the network application is included in an application plane of the software defined network.

12. The non-transitory computer readable medium of claim 11, wherein the operations further include compiling input data into the value of the control word, the input data corresponding to a network observability requirement specified by the network application.

13. The non-transitory computer readable medium of claim 8, wherein the operations further include configuring, based on the value of the control word, a second trigger condition of the set of trigger conditions of the probe block to evaluate the monitored network traffic accessible via the first probe input to determine whether the monitored network traffic has the first characteristic.

14. The non-transitory computer readable medium of claim 13, wherein the first trigger condition provides an upper bound on a parameter associated with the first characteristic, and the second trigger condition provides a lower bound on the parameter associated with the first characteristic.

15. A method to monitor a software defined network, the method comprising:
- enabling, by executing an instruction with a processor and based on a value of a control word, a first probe input of a set of probe inputs of a probe block, the first probe input mapped to a source of monitored network traffic in the software defined network;
- configuring, by executing an instruction with the processor and based on the value of the control word, a first trigger condition of a set of trigger conditions of the probe block to evaluate the monitored network traffic accessible via the first probe input to determine whether the monitored network traffic has a first characteristic; and
- configuring, by executing an instruction with the processor and based on the value of the control word, a first probe output of a set of probe outputs of the probe block to output a result of the monitored network traffic being evaluated according to the first trigger condition, the first probe output to output the result to a network application of the software defined network.

16. The method of claim 15, wherein the first probe input is mapped to the source of the monitored network traffic via a configurable lookup table, and the enabling of the first probe input includes configuring at least one of logic gates, logic operations or switches to pass or block the first probe input based on the value of the control word.

17. The method of claim 15, wherein the probe block is included in a device in a data plane of the software defined network, and the network application is included in an application plane of the software defined network.

18. The method of claim 17, further including compiling input data into the value of the control word, the input data corresponding to a network observability requirement specified by the network application.

19. The method of claim 15, further including configuring, based on the value of the control word, a second trigger condition of the set of trigger conditions of the probe block to evaluate the monitored network traffic accessible via the first probe input to determine whether the monitored network traffic has the first characteristic.

20. The method of claim 19, wherein the first trigger condition provides an upper bound on a parameter associated with the first characteristic, and the second trigger condition provides a lower bound on the parameter associated with the first characteristic.

* * * * *